US006906519B2

United States Patent
Abele et al.

(10) Patent No.: US 6,906,519 B2
(45) Date of Patent: Jun. 14, 2005

(54) SUPERCONDUCTING MAGNET, PARTICULARLY FOR MRI IMAGING APPARATI AND METHOD OF USING SAME

(75) Inventors: Manlio G. Abele, New York, NY (US); Franco Bertora, Genoa (IT)

(73) Assignee: Esaote S.p.A., Casale Monferrato (IT)

(*) Notice: Subject to any disclaimer, the term of this patent is extended or adjusted under 35 U.S.C. 154(b) by 0 days.

(21) Appl. No.: 10/261,414

(22) Filed: Oct. 2, 2002

(65) Prior Publication Data
US 2003/0214376 A1 Nov. 20, 2003

(30) Foreign Application Priority Data

Oct. 2, 2001 (IT) .................................... SV2001A0034

(51) Int. Cl.[7] .................................................. G01V 3/00
(52) U.S. Cl. ...................................... 324/319; 335/296
(58) Field of Search ............................... 324/319, 320, 324/318, 300; 335/296

(56) References Cited

U.S. PATENT DOCUMENTS 5,001,448 A * 3/1991 Srivastava et al. .......... 335/301
5,227,756 A    7/1993 Hed
5,285,393 A * 2/1994 Abele et al. ................ 700/117
5,517,083 A * 5/1996 Whitlock ............... 315/111.71

FOREIGN PATENT DOCUMENTS

| EP | 0 591 542 B2 | 4/1994 |
| EP | 0 738 898 B1 | 10/1996 |
| EP | 0 774 670 A1 | 5/1997 |
| EP | 0 817 211 A1 | 1/1998 |
| WO | 01/31358 A1 | 5/2001 |

* cited by examiner

Primary Examiner—Louis Arana
(74) Attorney, Agent, or Firm—Burns, Doane, Swecker & Mathis, L.L.P.

(57) ABSTRACT

A superconducting magnet, in which a static magnetic filed is generated in a region of interest, i.e. a predetermined volume in which the part under examination has to be placed for imaging characterised in that it is provided with means for generating a uniform annular distribution of electric currents enclosing the polyhedral cavity.

23 Claims, 8 Drawing Sheets

SUPERCONDUCTING MAGNET, PARTICULARLY FOR MRI IMAGING APPARATI AND METHOD OF USING SAME

CROSS-REFERENCE TO RELATED APPLICATIONS

The present application claims the priority of Italian Patent Application No. IT SV2001A0000034, filed on Oct. 2, 2001, the entire contents of which is hereby incorporated herein by reference.

BACKGROUND OF THE INVENTION

1. Field of the Invention

The invention relates to a superconducting magnet, in which a static magnetic filed is generated in a region of interest, i.e. a predetermined volume in which the part under examination has to be placed for imaging.

The invention deals with magnets having a closed current distribution as well as magnets having an open current distribution which are derived from the closed ones.

2. Discussion of Related Art

Real time NMR imaging in a surgical procedure requires open magnets that facilitate access to the surgical area by the surgeon and the surgical instrumentation. Furthermore, a magnet must be designed for a field high enough to achieve an image reconstruction within acceptable time intervals. Such a requirement results in rather larger magnetic structures, particularly in the case of permanent magnets. For high fields, well above 1 Tesla, a magnet design cannot make use of ferromagnetic materials that saturate above 1.5 Tesla, and a design based on permanent magnets with remanences below 1.5 Tesla becomes very inefficient. As a consequence, very high fields are the domain of superconducting magnets and low to medium fields up to a 0.5 Tesla range are now the undisputed domain of permanent magnets.

In the 1 Tesla range, superconducting and permanent magnet technologies can both be used to provide for efficiently generating the magnetic field having the desired strength and homogeneity.

Furthermore both technologies may be combined in designs that take full advantage of both technologies resulting in powerful and efficient new structures.

OBJECTS AND SUMMARY

Accordingly, it is an object of the present invention to provide for a closed magnet structure using the superconducting magnet technique in order to generate magnetic fields with a magnitude about 1 Tesla and reducing at the same time the dimensions and weight of the magnetic structure.

Another object of the present invention is to provide for an open magnet structure using the superconducting magnet technique in order to generate magnetic fields with a magnitude about 1 Tesla and reducing at the same time the dimensions and weight of the magnetic structure.

It is a further object of the present invention to provide an open superconducting magnet having high order harmonic correction means of the field distortions of different harmonic order in the region of the opening.

One embodiment of the invention achieves its first aim by providing a closed superconducting magnet with means for generating a uniform annular distribution of electric currents enclosing the polyhedral cavity. Furthermore the distribution of electric currents is composed of uniform surface currents on interfaces towards the enclosed cavity; on opposed plane peripheral boundaries surfaces and in which the current density at each peripheral boundary surface is defined by $$\vec{j_{1,h}} = -\vec{\eta} \times \vec{H}_h$$

where $\vec{\eta}$ is a unity vector perpendicular to the corresponding peripheral plane boundary and $\vec{H}_h$ is the intensity vector associated with the region enclosed by said plane boundary.

According to a further embodiment, the structure of currents may be divided into different regions each one having a correspondent interface to the polyhedral cavity and a correspondent peripheral boundary surface towards the external medium and each one having an adjacent region and a common plane interface to that adjacent region.

In this case, the current at the peripheral boundary of each region being defined by $$\vec{j_{1,h}} = -\vec{\eta} \times \vec{H}_h$$

where $\vec{\eta}$ is a unity vector perpendicular to the external plane boundary of the h-region and oriented outwards with reference to the centre of the cavity; and $\vec{H}_h$ is the field intensity at the h-region or at the h-field generating element.

A uniform field solution exists for any combination of intensity vectors Hh, Hh+1 of the different regions of the current structure, for which the tips of the intensity vectors lay on ideal lines parallel to the corresponding interfaces to the cavity, the origin being defined by the common intersection axis of two adjacent or subsequent interfaces of adjacent or subsequent regions of the opened annular structure of currents.

The orientation of the difference vector of the magnetic intensity vectors of two adjacent or subsequent regions defines the orientation of the common plane interface between two subsequent or adjacent regions.

The magnitude of the difference vector defines the current density at the plane common interface between the regions.

The peripheral plane boundaries of each region is parallel to the intensity vector of the field generated in the said region or by the same field generating element.

The current density on each interface may, be generated by independent sources corresponding to the different regions. Thus the closed superconducting magnet is formed by several coils, the windings of which enclose polyhedral volumes having shapes corresponding to the geometrical shape of the different regions in which the structure of current is divided extending over the surfaces of the said volumes.

In this case, the current density on each face of the winding is defined by:

$$\vec{j}_{h,k} = -\vec{\eta}_{h,k} \times \vec{H}_h$$

where index h defines the different volumes of the different regions and k the different faces of the ideal geometric figure defining the said volume.

Further improvements or embodiments are described with more detail in the following detailed description of the preferred embodiments.

An open magnet structure according to a preferred embodiment of the present invention includes means for generating a uniform annular distribution of electric currents enclosing the polyhedral cavity.

The distribution of currents is defined according to a correspondent closed distribution of currents which is opened at the relevant region for carrying out imaging.

Similarly to the closed magnet structure according to the embodiments disclosed above, also in the case of the open superconducting magnet the distribution of electric currents is composed of uniform surface currents on interfaces towards the enclosed cavity; on opposed plane peripheral boundaries surfaces; and in which the current density at each peripheral boundary surface is defined by $$\vec{j}_{1,h} = -\vec{\eta} \times \vec{H}_h$$

where $\vec{\eta}$ is a unity vector perpendicular to the corresponding peripheral plane boundary and $\vec{H}_h$ is the intensity vector associated with the region enclosed by said plane boundary.

Also in the case of the open magnet structure, the structure of currents may be divided into different regions each one having a correspondent interface to the polyhedral cavity and a correspondent peripheral boundary surface towards the external medium and each one having an adjacent region and a common plane interface to that adjacent region, except at the relevant which correspond to one of the said region in which the structure of currents is divided and at which the opening of the structure is provided where the said common plane interfaces of the end regions forms the two opposite surfaces delimiting the relevant region.

In this case, the current at the peripheral boundary of each region being defined by $$\vec{j}_{1,h} = -\vec{\eta} \times \vec{H}_h$$

where $\vec{\eta}$ is a unity vector perpendicular to the external plane boundary of the h-region and oriented outwards with reference to the centre of the cavity; $\vec{H}_h$ is the field intensity at the h-region or at the h- field generating element.

A uniform field solution exists for any combination of intensity vectors Hh, Hh+1 of the different regions of the current structure, for which the tips of the intensity vectors lay on ideal lines parallel to the corresponding interfaces to the cavity, the origin being defined by the common intersection axis of two adjacent or subsequent interfaces of adjacent or subsequent regions of the opened annular structure of currents.

The orientation of the difference vector of the magnetic intensity vectors of two adjacent or subsequent regions defines the orientation of the common plane interface between two subsequent or adjacent regions.

The magnitude of the difference vector defines the current density at the plane common interface between the regions.

The peripheral plane boundaries of each region is parallel to the intensity vector of the field generated in the said region or by the same field generating element.

The current density on each interface may be generated by independent sources corresponding to the different regions. Thus the open superconducting magnet is formed by several coils, the windings of which enclose polyhedral volumes having shapes corresponding to the geometrical shapes of the different regions in which the structure of current is divided extending over the surfaces of the said volumes.

In this case, the current density on each face of the winding is defined by:

$$\vec{j}_{h,k} = -\vec{\eta}_{h,k} \times \vec{H}_h$$

where index h defines the different volumes of the different regions and k the different faces of the ideal geometric figure defining the said volume.

Further improvements or embodiments are described with more detail in the following detailed description of the preferred embodiment.

According to a further embodiment, an open superconducting magnet is constructed according to a hybrid design approach. In this embodiment, the structure combines superconducting windings and permanent magnets as well as ferromagnetic materials.

Some rare-earth magnetic alloys exhibit high intrinsic coercivity, and cannot be demagnetized in strong fields far above 1 Tesla. As a consequence, both ferromagnetic materials and high intrinsic coercivity permanent magnets can be used to generate the desired field configuration in the region of interest at field levels exceeding 1 Tesla. Conversely, the total flux of the induction can be effectively generated and channeled in the superconducting windings where large electric currents make it possible to minimize the magnet dimensions.

The above mentioned embodiment includes providing a filter structure for compensating the low order harmonic magnetic field distortion at the relevant region where imaging is to be carried out by providing at the opposed and spaced apart interface surfaces defining the opening of the cavity plates of ferromagnetic materials and/or permanent magnets.

The relevant theory and the particular construction is disclosed in the following detailed description of the drawings.

DETAILED DESCRIPTION OF THE REFERRED EMBODIMENTS

Figure 1:
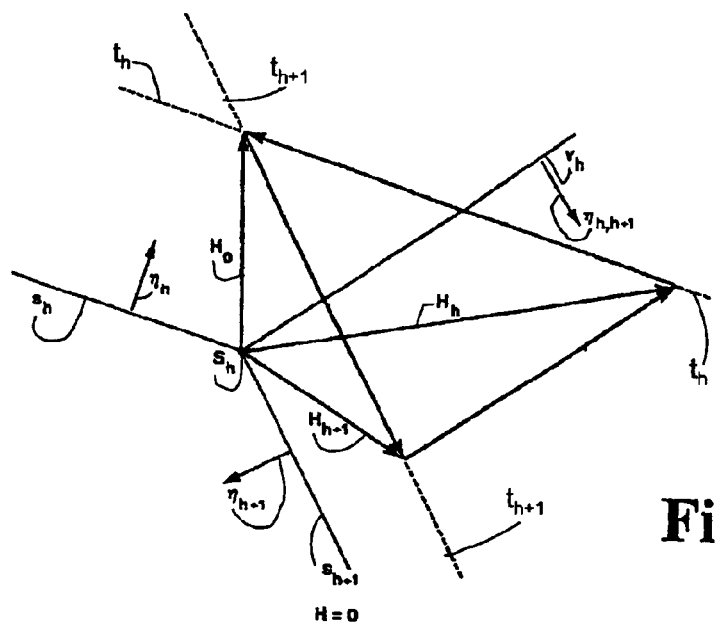
FIG. 1 is a schematic view of a structure of uniform surface current densities at two adjacent regions of a closed current structure.

FIG. 1 shows a schematic view of a structure of uniform surface current densities at two adjacent regions of a closed current structure.

Figure 4:
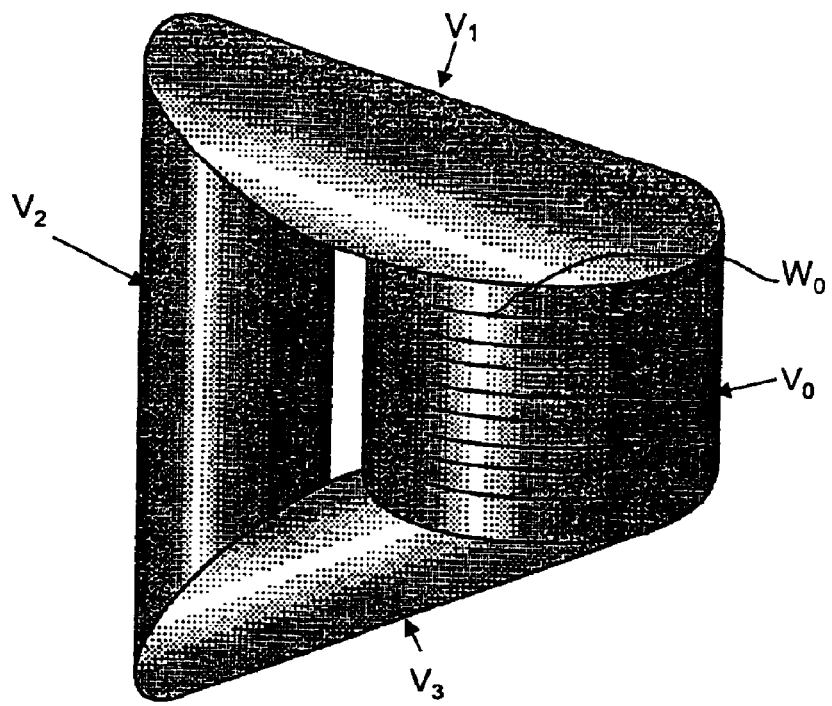
FIG. 4 shows a perspective view of a closed current structure from which also the open structure according to an embodiment of the present invention is derived.
Figure 5:
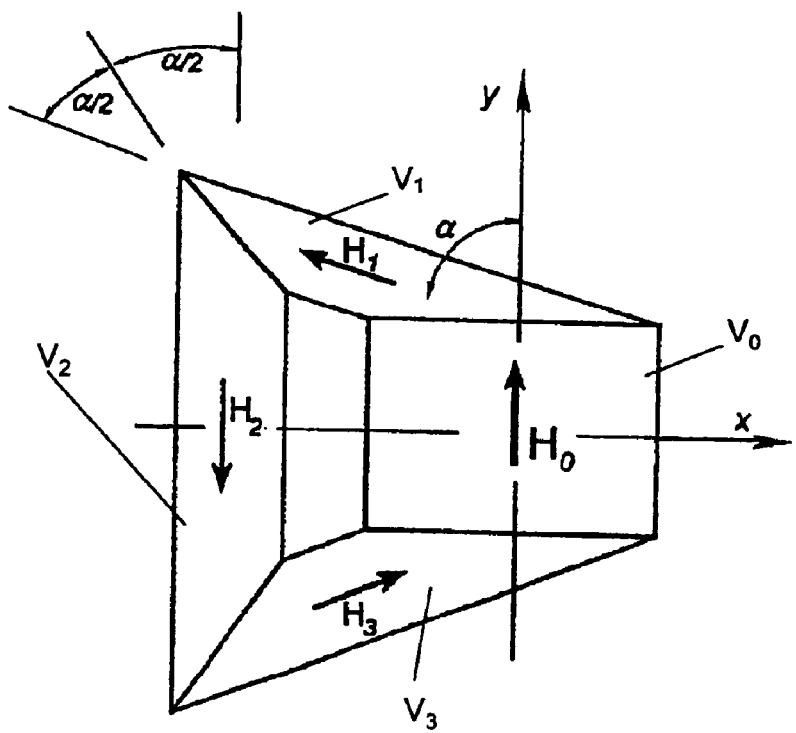
FIG. 5 shows a schematic side view of the structure according to FIG. 4.

A uniform field $\vec{H}_o$ can be generated in an arbitrarily assigned closed polyhedral cavity by enclosing the cavity either in a structure of a uniformly magnetized polyhedron or a structure of electric currents as illustrated in FIGS. 4 and 5. A self-shielding distribution of electric currents is composed of uniform surface currents on plane surfaces, as indicated in the schematic of FIG., 1, where surface current densities $\vec{j}_h$, $\vec{j}_{h+1}$ flow on interfaces $s_h$, $s_{h+1}$ that are part of the boundary of the polyhedral cavity. The uniform field $\vec{H}_0$ and the plane interfaces $s_h$, $s_{h+1}$ postulate uniform intensities in the two regions that interface with the cavity, and, as a consequence, the two regions must have a common plane interface $V_h$ as indicated in FIG. 1, where a uniform current density flows to satisfy the boundary conditions. The condition of existence of a uniform field solution in a structure of electric currents is equivalent to the condition of existence of a uniform field solution in a structure of permanent magnets.

Figure 2:
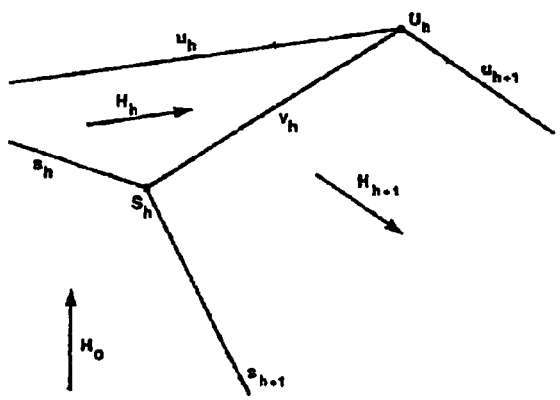
FIG. 2 is a schematic view of a current structure according to the present invention for field confinement within peripheral boundaries at two adjacent regions, i.e., field generating elements.

FIG. 2 shows the basic schematic of a self-shielding structure of electric currents that generates a uniform field. $\vec{H}_h$, $\vec{H}_{h+1}$ are the intensities in the two regions that interface with the magnet cavity through boundaries $s_h$, $s_{h+1}$. Any combination of vectors $\vec{H}_h$, $\vec{H}_{h+1}$ whose tips belong to the dashed lines $t_h$, $t_{h+1}$ parallel to the interfaces, as shown in FIG. 1 is consistent with the existence of a uniform field solution. The orientation of vector $\vec{H}_h - \vec{H}_{h+1}$ determines the orientation of interface, $V_h$ and the magnitude of $\vec{H}_h - \vec{H}_{H+1}$ determines the magnitude of the current density at $V_h$. Intensities $\vec{H}_h$, $\vec{H}_{h+1}$ can be confined within the plane boundaries $u_h$, $u_{h+1}$ parallel to the intensities as shown in FIG. 2, if the current densities on $u_h$, $u_{h+1}$ are $$\overrightarrow{j_{1,h}} = -\vec{\eta} \times \vec{H}_h, \quad \overrightarrow{j_{1,h+301}} = -\vec{\eta} \times \vec{H}_{h+1} \tag{2.1}$$

where unit vectors $\vec{\eta}$ are perpendicular to $u_h$, $u_{h+1}$ and oriented outward with respect to the structure. By virtue of equations (2.1) the field vanishes in the external medium and is uniform in each region of the structure.

Figure 3:
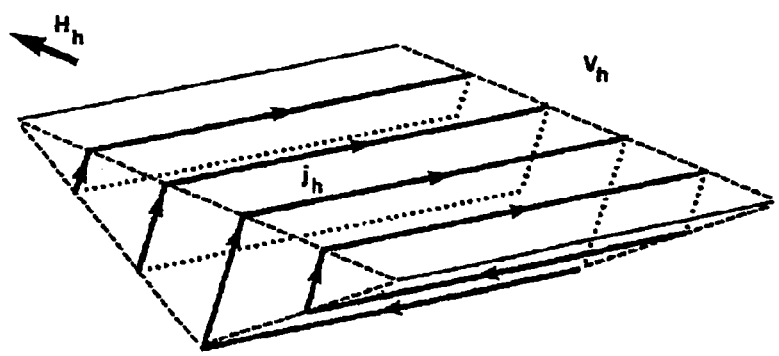
FIG. 3 shows a field generating element formed by an independent winding with uniform surface current densities.

The current density on each interface can be generated by independent sources. The solution adopted according to the invention is based on dividing the structure in independent windings around each region $V_h$, where the field has an intensity $\vec{H}_h$, as shown in FIG. 3.

The current density $\vec{j}_h$ on each face of Vh identified by subindex k is $$\vec{j}_{h,k} = -\vec{\eta}_{h,k} \times \vec{H}_h \tag{2.2}$$

where unit vector $\vec{\eta}_{h,k}$ is perpendicular to the k-th face and oriented outward with respect to $V_h$.

Figure 6:
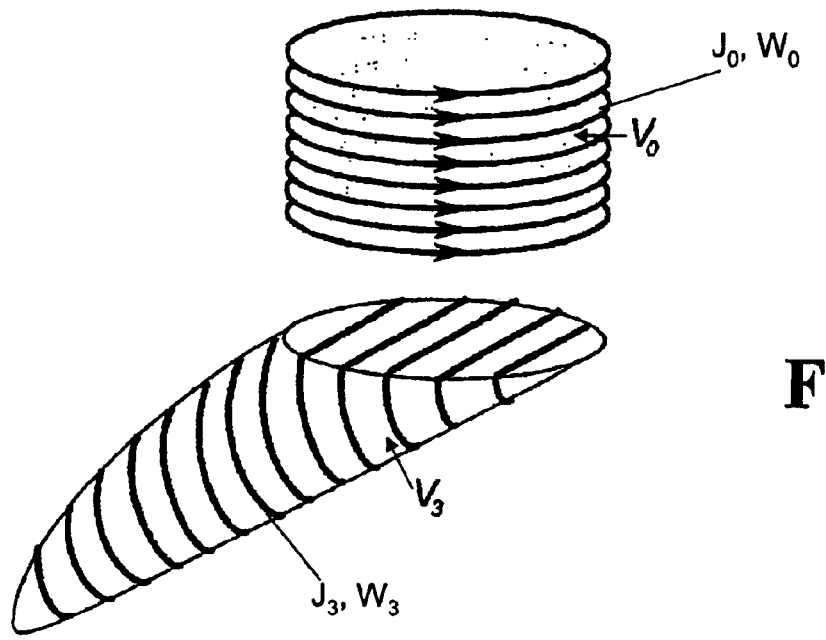
FIG. 6 shows the independent windings of the closed current structure according to FIGS. 4 and 5.

The open magnet according to the invention is based on a closed structure of electric currents whose schematic is shown in FIGS. 4 and 5. It is a ring configuration with a winding $W_0$ of circular cross-section of radius $r_0$, which is associated with the region $V_0$, and three windings $W_1$, $W_2$, $W_3$, which are associated with the regions $V_1$, $V_2$, $V_3$, the windings being of elliptical cross-section whose major axis, equal to $r_0$, is oriented along the axis z. FIG. 4 shows an overall view of the structure and FIG. 5 shows its cross-section in the plane of symmetry z=0. For each winding $W_0$, $W_1$, $W_2$, $W_3$, the corresponding field $H_0$, $H_1$, $H_2$, $H_3$ is illustrated. Winding $W_2$ is not illustrated in detail since its construction is given analogously by applying the above-illustrated general teaching. The open magnet is obtained by opening the annular current distribution. For example, the winding $V_0$ is an open solenoid as shown in FIG. 6. The surface current density $\vec{j}_0$ is uniform and oriented perpendicular to y. Its magnitude is $j_0 = H_0$.

The three windings $W_1$, $W_2$, $W_3$ are closed and carry uniform current densities $$j_1 = j_2 = j_3 = \frac{j_0}{\cos\alpha} \tag{2.3}$$

where $\alpha$ is the angle between the axis of winding $V_1$ relative to the axis y, as shown in FIG. 5. The view of $V_3$ is presented in FIG. 6 which shows the electric current distribution on the interface between $V_3$ and $V_1$.

Winding $V_o$ is assumed to enclose the region of interest of the magnet where the imaging is performed. By virtue of equation (2.3), the selection of the angle $\alpha \neq 0$ results in a smaller cross-sectional area of $V_1$, $V_2$, $V_3$ compared to $V_0$ and as a consequence, it results in a reduction of the magnet dimensions. The field uniformity is maintained as long as the magnet of FIG. 4 is a closed structure. Obviously, the winding $V_0$ must be open in order to provide access to the region of interest. In a first approximation, the winding $V_0$ is omitted.

A distortion of the field results from the opening, as well known in the art. The field distortion in the region of interest must be partially compensated in order to achieve the desired degree of uniformity within the imaging region. This can be accomplished by means of electric currents surrounding the opening of $V_0$, designed to compensate for the lower order harmonics of the field distortion. The technique according the invention and defined in the following, involves the use of a filter structure composed of ferromagnetic materials and permanent magnets.

Figure 7:
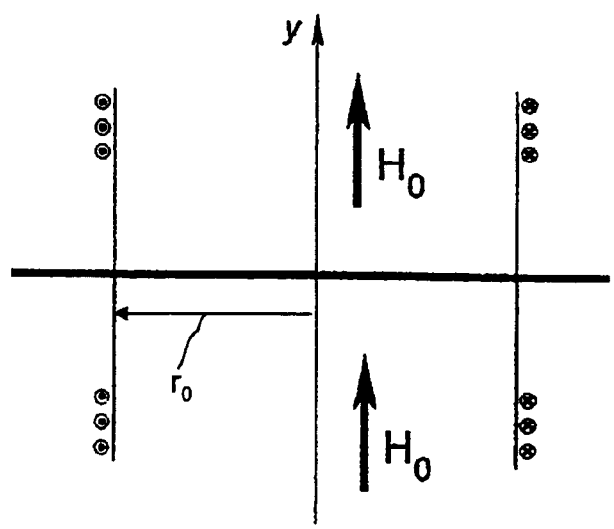
FIG. 7 show the insertion of a plate having infinite permeability perpendicular to the axis of the field of the relevant region, i.e., the region where imaging is performed.

The schematic of FIG. 7 shows an ideal plane plate of infinite magnetic permeability and zero thickness inserted in a solenoid of infinite length in a plane perpendicular to the axis of the solenoid.

The plate extends arbitrarily in the external medium where the field is zero. Because the plate is perpendicular to the field generated by the solenoid, its insertion does not affect the field. In practice, the plate consists of a ferromagnetic medium of high magnetic permeability and finite thickness. As long as the ferromagnetic medium does not saturate at the field level generated by the current, the effect of its insertion in the solenoid can be computed as a linear problem where the plate acquires a given potential induced by the current.

Figure 8:
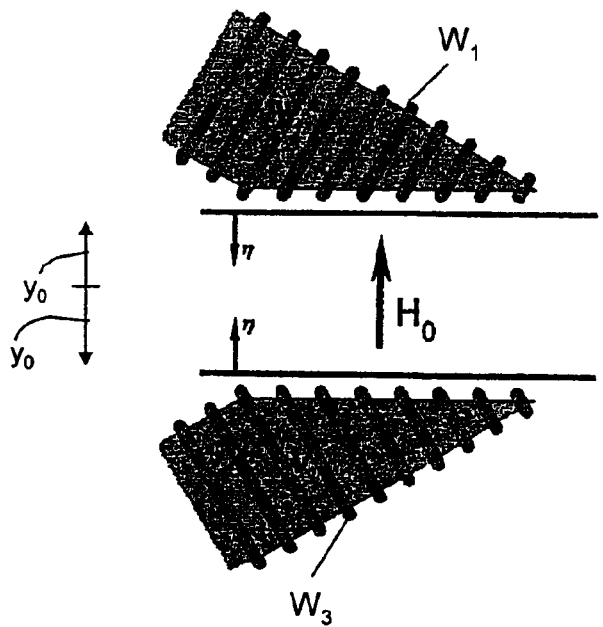
FIG. 8 shows the region of the opening of the superconducting magnet according to an embodiment of the invention with two pole plates.
Figure 9:
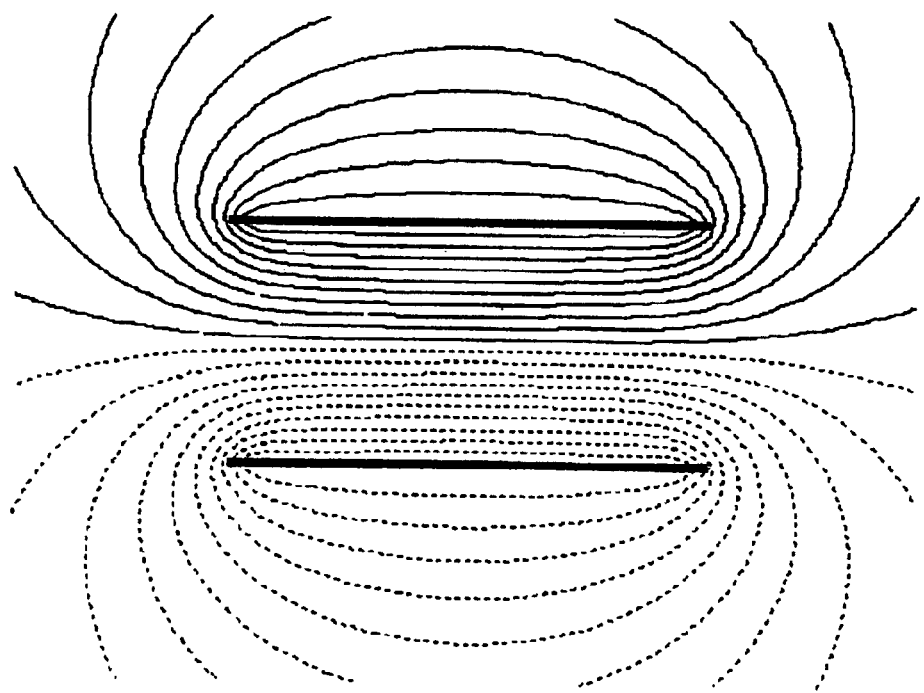
FIG. 9 shows the equipotential lines between two plates

Based on these considerations, the magnetic structure is opened by replacing the winding $W_0$ of FIGS. 4 and 6 with the pair of ferromagnetic plates located at the interfaces of windings $W_1$ and $W_3$ of the regions $V_1$, $V_3$ as indicated in the schematic of FIG. 8 that is the basis for the design of the pole pieces of the magnet. The plates are assumed to be coaxial with the axis y, circular with a radius $r_e$ equal or larger than the radius $r_0$ of the original winding $V_0$ and at a distance $2y_0$ from each other. see also FIGS. 10 and 11. Because of symmetry, $\pm\Phi_0$ are the values of the magnetostatic potential induced by the magnet on the two plates. The field configuration between the plates is illustrated by the equipotential lines shown in FIG. 9, computed on the assumption of infinite magnetic permeability $\mu$. Because the two $\mu=\infty$ plates act as perfect magnetic mirrors, the magnetostatic potential $\Phi(r, \psi, y)$ generated between the plates, within a cylinder of radius $r_i<r_e$ can be expanded in the series of cylindrical harmonics $$\Phi(r, \psi, y) = \Phi_0 \frac{y}{y_0} + \sum I_m\left(n\pi\frac{r}{y_0}\right) \quad (3.1)$$

$$[a_{m,n,1}\cos m\psi + a_{m,n,2}\sin m\psi]\sin m\pi\frac{y}{y_0}$$

where Im is a modified Bessel function of the third kind. The terms of the sum are spatial harmonics of the field distortion caused by the finite radial dimensions of the plates. The terms $m\pm 0$ are the harmonics resulting from the geometry of the windings of the structure, as well as the tolerances of materials and magnetic fabrication. As long as the radial dimensions of the plates are large compared to the gap $2y_0$, the magnitude of the of harmonics decreases rapidly with increasing values of m,n and the distortion is basically limited to lower order harmonics.

The elimination of the significant harmonics of the field distortion is accomplished by means of a structure attached to the ferromagnetic plates that acts as a spatial filter, following a technique developed by one of the inventors in recent years. The design of the filter is based on a modulation $\overline{\Phi}$ of the potential of the plates outside the cylinder of radius $r_i$ that is defining the radial extent of the relevant region, i.e., the imaging region. The distribution of the modulation $\overline{\Phi}$ is provided by the solution of the system of equations $$\frac{\pi}{y_0^2}(-1)^n n \int_0^{2\pi} d\psi \int_{r_i}^{r_e} rK_m\left(n\pi\frac{r}{y_0}\right)\Phi(r,\psi)\binom{\cos m\psi}{\sin m\psi}dr = (a_{m,n})_1^2 \quad (3.2)$$

where Km is a modified Bessel function of the third kind. A solution of system (3.2), applicable to the lower order harmonics, is obtained by dividing the area of the plates between $r_i$ and $r_e$ in a series of $n_0$ concentric rings each composed of a number $m_0$ of angular sectors, where each sector has a uniform value $\overline{\Phi}_{h,k}$ of the potential modulation $\overline{\Phi}$. The optimization of the ring structure results in the selection of a radial dimension $\Delta$ rh of the h-th ring $$\Delta r_h = \frac{y_0}{h\pi} \quad (h = 1, 2, 3, \dots) \quad (3.3)$$

where the rings are numbered starting from the outermost ring of external radius $r_e$. The modulation $\overline{\Phi}_{h,k}$ of the potential assumes a surface of distribution of dipole moments on the surface of the plates, with a dipole moment per unit surface $\vec{p}_{h,k}$ in each sector equal to $$\vec{p}_{h,k} = \mu_0 \overline{\Phi}_{h,k} \vec{\eta} \quad (3.4)$$

where unit vector $\vec{\eta}$ is oriented perpendicular to the plate, as indicated in FIG. 8.

Figure 10:
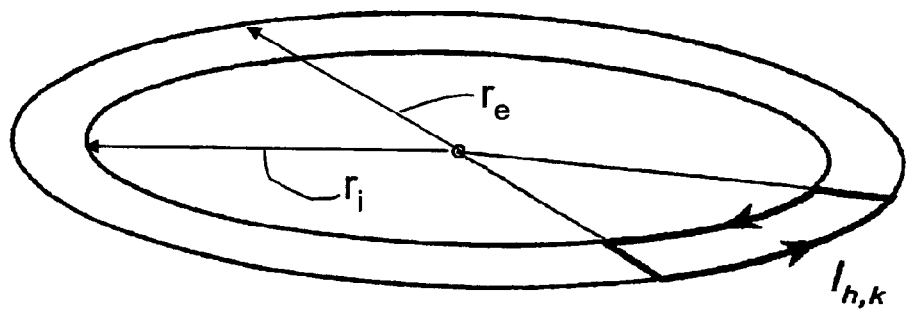
FIG. 10 shows an equivalent current loop component of the filter structure formed by ferromagnetic plates.

The solution of Eqs. (3.2) results in the potential modulations $\overline{\Phi}_{h,k}$ oscillating from positive to negative values from one ring to another. As a consequence, the orientation of dipole moment $\vec{p}_{h,k}$ oscillates from parallel to opposite the intensity $\vec{H}_0$ from one ring to another, starting with a parallel orientation in the outermost ring. The distribution of $\vec{p}_{h,k}$ can be implemented with layers of permanently magnetized material of remanence $\vec{J}$ and thickness $y_{h,k}$. In this solution, the rings where $\vec{J}$ is oriented opposite to $\vec{H}_0$ require the selection of a high intrinsic coercivity material, to avoid its demagnetization. The dipole, moments $\vec{p}_{h,k}$ can also be implemented by virtue of the equivalence of magnetized materials and electric currents by transforming each sector of the filter structure into a loop carrying an electric current $I_{h,k}$ of magnitude $$p_{h,k} = \mu_0 I_{h,k} \quad (3.5)$$

as indicated in the schematic of FIG. 10.

As a third option, the solution of Eqs. 3.2 can be used to replace the ferromagnetic plates with passive pole pieces, by transforming equipotential surfaces generated by the filter structure between the plates onto the surfaces of high magnetic permeability materials.

Figure 11:
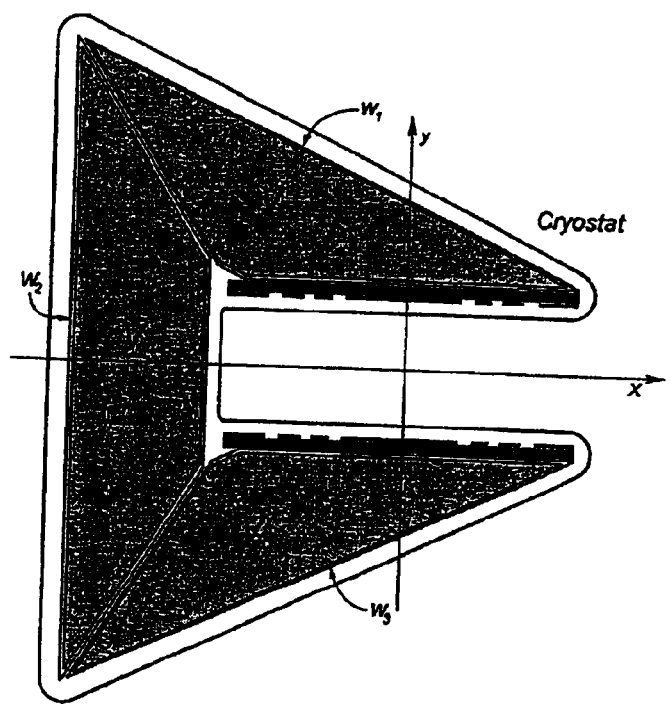
FIG. 11 is a schematic cross section of the open superconducting magnet with filters according to an embodiment of the invention.
Figure 12:
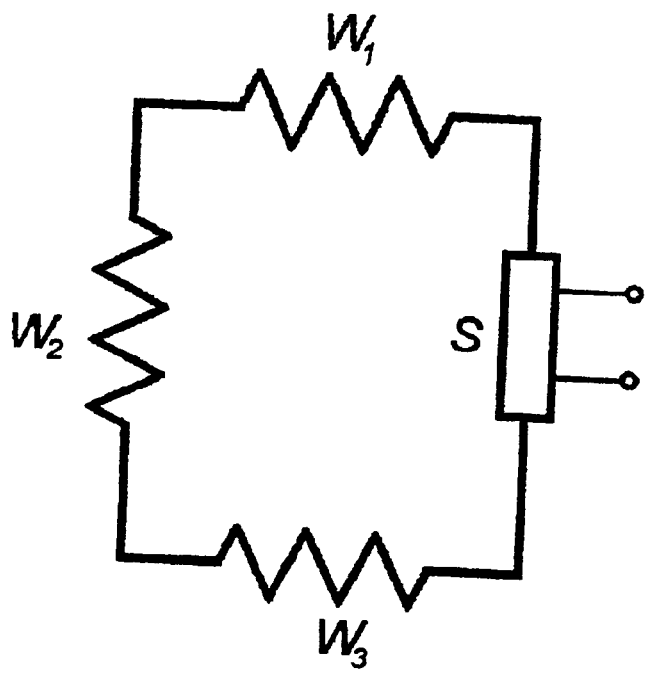
FIG. 12 is a diagram of the superconducting shunt.

The schematic of the superconducting magnet is presented in FIG. 11, which shows the magnet cross-section in the plane x,y. The heavy lines $W_1$, $W_2$, $W_3$ represent the cross-section of the superconducting conductors that are supported by three structures $V_1$, $V_2$, $V_3$. The schematic of FIG. 11 corresponds to a selection of an angle $\alpha=30°$ defined in FIG. 5. Thus the basic geometry of FIG. 11 corresponds to a value of the field intensity in each winding equal to twice the value of the intensity $H_0$ within the region of interest. The three windings are assumed to be wound in a single layer on $V_1$, $V_2$, $V_3$ and are connected in series as indicated in the schematic of FIG. 12 where S represents the superconducting shunt.

Because of symmetry, the pitch of the windings is the same on the surfaces of $V_1$, $V_2$, $V_3$ that form the two plane interfaces between $V_1$, $V_2$ and $V_2$, $V_3$.

Figure 13:
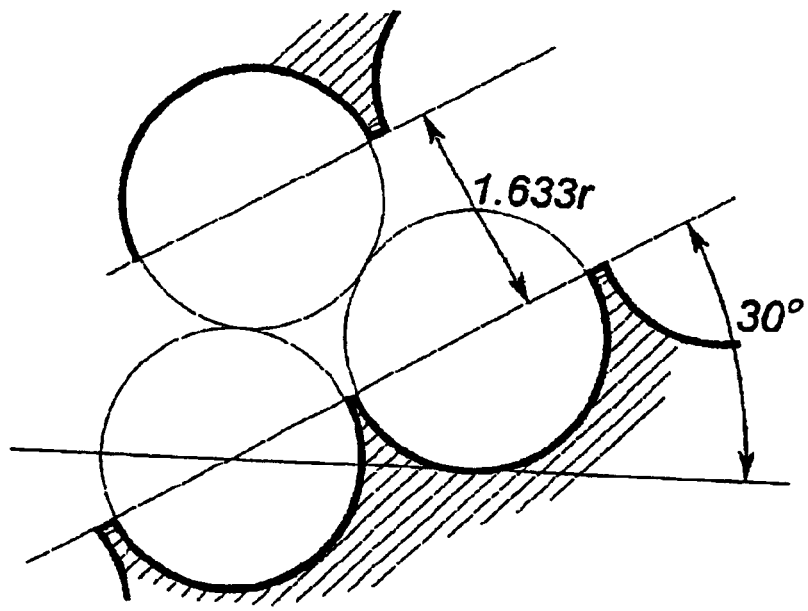
FIG. 13 shows the arrangement of the conductors at the interfaces between adjacent windings of adjacent field generating elements.

Assume circular conductors of radius $r\omega$. FIG. 13 shows the relative position of the layers of the superconductors, with the assumption that the loops of the conductors are tangent to each other on the external surfaces of $V_1$, $V_2$, and $V_3$.

FIG. 10 shows that the winding of $V_o$ of the schematic of FIG. 4 is replaced by the structure of the two ferromagnetic parallel plates that form the pole pieces of the magnet. The central part of each plate ($r<r_i$) is the reference plane surface that establishes the dimension $2y_o$ of the reference system of the expansion (3.1) of the cylindrical harmonics. The external part of each plate ($r_i<r<r_e$) is the filter structure designed to cancel the harmonics. Each of the three options mentioned, or a combination of them, can be selected to design the filter structure.

In principle the generation of the dipole moments $\vec{p}_{h,k}$ by means of electric currents distributed on the surface of each plate can result in a minimum volume of the filter structure and this is particularly true for the outer ring that compensates for the dominant fundamental harmonic (n=1).

By virtue of the theorem of equivalence of magnetization of electric currents, the surface current density $\vec{j}$ that replaces a surface dipole moment density $\vec{p}$ is $$\vec{j} = \frac{1}{\mu_0} \nabla \times \vec{p} \qquad (4.1)$$

where $\vec{j}$, oriented parallel to the plate surface, satisfies the condition of continuity $$\nabla \cdot \vec{j} = 0 \qquad (4.2)$$

Eq (4.1) transforms into $$\nabla \cdot \vec{j} = -\frac{1}{\mu_0} \nabla^2 p \vec{y} \qquad (4.3)$$

p is a continuous function of position, oscillating between positive and negative values, with maxima and minima within the area $r_i < r < r_e$, p cannot be an harmonic function and the lines of flow of $\vec{j}$ may close upon themselves within the area of the filter structure. In a polar coordinate system $(r,\psi,y)$, by virtue of (4.1), the components of $\vec{j}$ are:

$$j_r = \frac{1}{\mu_0 r} \frac{\partial p}{\partial \psi}, \quad j_\psi = -\frac{1}{\mu_0} \frac{\partial p}{\partial r} \qquad (4.4)$$

The differential equation of the lines of flux of $\vec{j}$ is $$\frac{1}{r} \frac{dr}{d\psi} = \frac{j_r}{j_\psi} \qquad (4.5)$$

i.e., by virtue of (4.4) one has $$\frac{\partial p}{\partial r} \frac{dr}{d\psi} + \frac{\partial p}{\partial \psi} = 0 \qquad (4.6)$$

and the equation of the lines of flux of $\vec{j}$ is $$p(r,\psi) = const \qquad (4.7)$$

In general, because the solution of the system of Eqs.3.2 is a periodic function of $\psi$, the continuous distribution of $p(r,\psi)$ can be written in the form $$p(r,\psi) = \sum_m R_m(r) e^{im\psi} \qquad (4.8)$$

and if p is an harmonic function, $R_m(r)$ in Eq.(4.8) must be a solution of the equation $$r \frac{d}{dr}\left(r \frac{dR_m}{dr}\right) - m^2 R_m = 0 \qquad (4.9)$$

i.e., $$R_m = C_m r^{\pm m} \qquad (4.10)$$

in which case, for each value of m, the filter structure is limited to the cancellation of a single harmonic of an assigned order m. Assume for instance that the mth term of series (4.8) is $$p_m(r_i, v) = C_m \left[\left(\frac{r}{r_i}\right)^m - \left(\frac{r_i}{r}\right)^m\right] \cos(m\psi) \qquad (4.11)$$

where constant $C_m$ is designed to cancel coefficient am,n in expansion (3.1). Constant $C_m$ is given by $$\frac{(-)^n}{\mu_0 y_0} \left| \frac{r^{m+1}}{r_i^m} K_{m+1}\left(n\pi \frac{r}{y_0}\right) - \frac{r_i^m}{r^{m-1}} K_{m-1}\left(n\pi \frac{r}{y_0}\right) \right|_{r_i}^{r_e} C_m = a_{m,n,1} \qquad (4.12)$$

Figure 14:
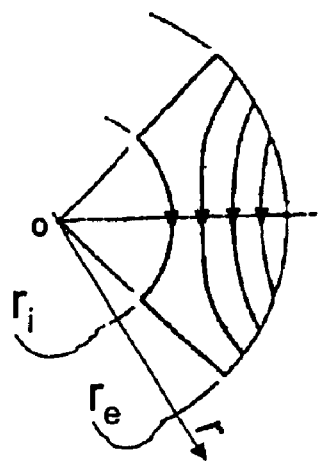
FIG. 14 shows the lines of flow of the current density in one element of the filter structure.

An example of line of flow of $\vec{j}$ is shown in FIG. 14 for m=2. The circle of radius $r_1$, where p2=0, is a line of flow of $\vec{j}$. In the particular case where m=0, no current flows within the region of the filter structure, and the uniform value of p in the structure is obtained with equal currents flowing in opposite directions in two loops concentric with the center of the plate, as the boundaries of the $r_i < r < r_e$ region.

Figure 15:
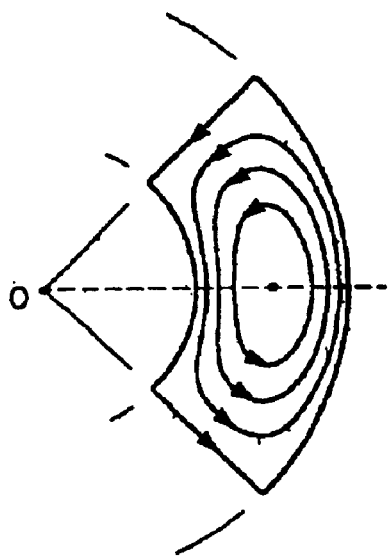
FIG. 15 shows an example of closed lines of the current density in one element of the filter structure.

FIG. 15 shows the lines of flux of $\vec{j}$ as an example of a nonharmonic function $$p(r,\psi) = C_m \left[i - 4\left(\frac{r-r_c}{r_e-r_i}\right)^2\right] \cos m\psi \qquad (4.14)$$

in the particular case m=2. $r_e$ in Eq. (4.14) is $$r_c = \frac{1}{2}(r_e - r_i) \qquad (4.15)$$

The radial boundaries $r=r_1$, $r=r_e$ of the filter structure are lines of flux of the current density that close upon themselves with the angular interval $\psi = \pm\pi/4$.

Another example of practical interest is the distribution of p independent of the radial coordinate $$p(\psi) = C_m \cos m\psi \qquad (4.16)$$

which results in the surface current density $$J_r = -\frac{mC_m}{\mu_0 r} \sin m\psi, \quad J_\psi = 0 \qquad (4.17)$$

Figure 16:
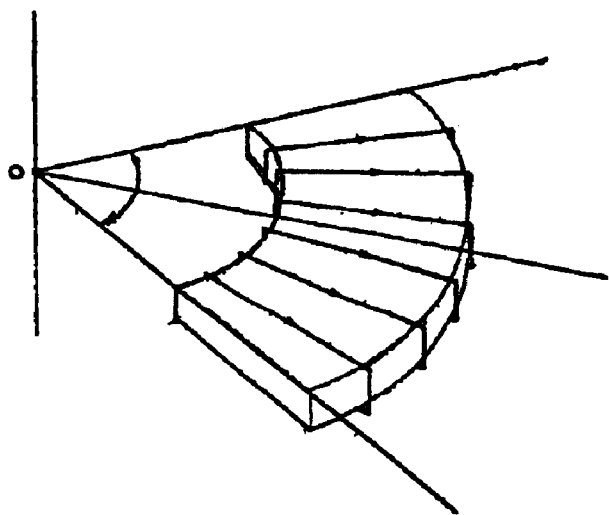
FIG. 16 shows the radial lines of flux

As shown in FIG. 16, the radial lines of flux of $\vec{j}$ close outside the $r_1 < r < r_e$ region.

The correction of the higher order harmonics of the field distortion involved the cancellation of small values of $\overline{\Phi_{h,k}}$ $$|\overline{\Phi}_{h,k}| << \Phi_0 \qquad (4.18)$$

In this case the h,k filter component can be reduced to a small dipole implemented by a cylinder of magnetized material located at the center of each filter sector, with a dipole moment $$M_{h,k} \sim p_{h,k} S_{h,k} \qquad (4.19)$$

where $S_{h,k}$ is the area of the sector. The cylinder of magnetized material can be replaced by a circular coil as shown in FIG. 17 of radial dimensions $r_1$, $r_2$ and height $z_1$ carrying a uniform current density i, with a dipole moment $$M_{h,k} = \mu_0 \frac{\pi I_{h,k}}{3}(r_1^2 + r_2^2 + r_1 r_2) \quad (4.20)$$

where $$I_{h,k} = (r_2 - r_1)_1 i_{h,k} \quad (4.21)$$

Figure 17:
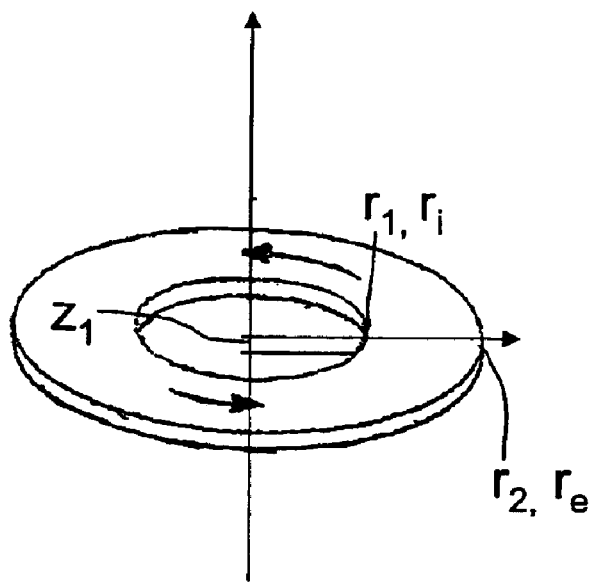
FIG. 17 show a circular coil.

The distribution of the equivalent dipole moment density generated by the coil is shown in FIG. 17.

The schematic of the pole pieces is shown in FIG. 17. The thickness of the plates is chosen to ensure the mechanical rigidity of the plates, particularly in the central region $r<r_i$ where the precision of the plate geometry and their relative position is most critical for achieving a high degree of field uniformity. As shown in FIG. 17, the external radius $r_e$ of the plates is larger than $r_0$. The effect of $r_e > r_0$ is an increase in the degree of uniformity within the imaging region $r<r_1$ where the component $B_y$ is plotted vs. the axis y for several values of the plate overhang $r_e - r_0$. The uniformity improvement is achieved at the cost of a reduction of the volume of the field within the region of imaging. Obviously in the limit $r_e \to \infty$, the asymptotic value of the field intensity between the plates vanishes.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A superconducting magnet, comprising:
    a polyhedral cavity in which a static magnetic field is generated, wherein a part under examination is placed in the cavity for imaging, and
    means for generating a uniform annular distribution of electric currents enclosing the polyhedral cavity.

2. The superconducting magnet according to claim 1, wherein the distribution of electric currents is composed of uniform surface currents on interfaces facing towards the polyhedral cavity, and on opposed plane peripheral boundary surfaces;
    and in the distribution, the current density at each peripheral boundary surface is defined by $$\vec{j}_{l,h} = -\vec{\eta} \times \vec{H}_h$$

where $\vec{\eta}$ is a unity vector perpendicular to the corresponding peripheral plane boundary and $\vec{H}_h$ is the intensity vector associated with the cavity enclosed by the plane boundary.

3. The superconducting magnet according to claim 1, wherein the distribution of electric currents is divided into different regions, each one having a correspondent interface to the polyhedral cavity and a correspondent peripheral boundary surface towards an external medium, and each one having an adjacent one of the regions and a common plane interface to that adjacent region, except at the interface which corresponds to one of the said regions in which the structure of currents is divided and at which the opening of the structure is provided where the said common plane interfaces of the end regions form the two opposite surfaces delimiting at the relevant region the current at the peripheral boundary of each region being defined by $$\vec{j}_{l,h} = -\vec{\eta} \times \vec{H}_h$$

where n is a unity vector perpendicular to the external plane boundary of the h-region and oriented outwards with reference to the centre of the cavity; and $\vec{H}_h$ is the field intensity at the h-region.

4. The superconducting magnet according to claim 3, wherein any combination of intensity vectors Hh, Hh+1 of the different regions of the distribution of electric currents, for which tips of intensity vectors lay on ideal lines parallel to the corresponding interfaces to the cavity, an origin being defined by a common intersecting axis of two adjacent or subsequent interfaces of adjacent or subsequent regions of the annular distribution of electric currents.

5. The superconducting magnet according to claim 4, wherein an orientation of a difference vector of the magnetic intensity vectors of two adjacent regions defines the orientation of the common plane interface between two adjacent regions.

6. The magnet according to claim 1, wherein the magnet has a closed annular shape enclosing the polyhedral cavity which forms a relevant region for carrying out imaging.

7. The superconducting magnet according to claim 1, wherein the magnet is an open superconducting magnet which has means for generating a uniform annular distribution of electric currents enclosing the polyhedral cavity and in which the said distribution of electric currents being defined according to a correspondent closed distribution of currents, which distribution is open at the relevant region for carrying out imaging.

8. The superconducting magnet according to claim 1, wherein the magnet is an open magnet that has a ring configuration and is formed of three independent windings of elliptic form, two of which windings have opposed parallel surfaces defining an opening of the ring configuration which corresponds to a fourth winding having a circular cross section, the major axis of the two opposed elliptic windings being equal one to the other and equal to a diameter of the fourth winding.

9. The open magnet according to claim 8, in which four winding are provided, the one having a circular cross-section being at least partially opened.

10. The open magnet according to claim 8, wherein the magnet is a combination of superconducting windings and permanent magnets or ferromagnetic materials.

11. The open magnet according to claim 10, wherein at an opening of the ring configuration a filter structure is provided for compensating a low order harmonic magnetic field distortion at a relevant region where imaging is to be carried out by providing at opposed and spaced apart interface surfaces defining the opening plates of ferromagnetic materials or permanent magnets.

12. The open magnet according to claim 10, wherein at interfaces of two opposite elliptic windings defining an opening of the magnet, ferromagnetic plates are provided on each interface, each of the ferromagnetic plates carries a filter element which modulates the potential of the filed outside the region where imaging is carried out.

13. The open magnet structure according to claim 12, wherein the filter elements are formed by one or more concentric rings, each of the rings being formed by one or more sectors, and each of the sectors having a predetermined uniform value modulation of the magnetic potential.

14. The open magnet according to claim 13, wherein the rings forming the filter elements are provided outside the region where imaging is performed.

15. The open magnet according to claim 12, wherein the filter elements comprise means for correcting distortions of high order, the means being formed by a cylinder or ring of magnetized material or equivalent electric current distributions each of which is associated with a magnetic dipole of one angular sector.

16. The open magnet according to claim 12, wherein the filter elements are formed by ferromagnetic elements.

17. The open magnet according to claim 12, wherein the filter elements are formed by a combination of ferromagnetic elements and magnetic dipoles generated either by permanent magnets or by electric currents.

18. The open magnet according to claim 10, further comprising means for modulating the magnetic potential at the ferromagnetic materials, the means being permanent magnetized dipoles.

19. The open magnet according to claim 10, further comprising means for modulating the magnetic potential at the ferromagnetic materials, the means being dipoles generated by electric currents.

20. A magnetic structure comprising an annular distribution of electric currents that are divided into a plurality of regions, wherein a magnitude of a difference vector defines a current density at a plane common between each of the regions.

21. The magnet according to claim 20, wherein peripheral plane boundaries of each region are parallel to an intensity vector of the field generated in the said region or by the same field generating element.

22. The magnet according to claim 20, wherein the current density on each interface may be generated by independent sources corresponding to the different regions, wherein the magnet is a superconducting magnet that is formed by several coils, the winding of which enclose polyhedral volumes having shape corresponding to the geometrical shape of the different region in which the structure of current is divided extending over the surfaces of the said volumes, the current density on each face of the winding being defined by, $$\vec{j}_{h,k} = -\vec{\eta}_{h,k} \times \vec{H}_h$$

where index h defines the different volumes of the different regions and k the different faces of the ideal geometric figure defining the said volume.

23. A method of using a superconducting magnet, comprising:

generating a uniform annular distribution of electric currents enclosing a polyhedral cavity;

generating a static magnetic field in the polyhedral cavity; and placing a part to be examined in the polyhedral cavity.

* * * * *